United States Patent [19]

Schlachter

[11] Patent Number: 5,541,539
[45] Date of Patent: Jul. 30, 1996

[54] DIGITAL CURRENT SWITCH

[75] Inventor: Hans-Heiner Schlachter, Neuried, Germany

[73] Assignee: Siemens Aktiengesellschaft, Munich, Germany

[21] Appl. No.: 108,399

[22] Filed: Aug. 18, 1993

[30] Foreign Application Priority Data

Aug. 18, 1992 [DE] Germany .................. 42 27 282.3

[51] Int. Cl.⁶ .................................................. H03K 5/27
[52] U.S. Cl. .................. 327/78; 327/53; 327/54; 327/391; 327/437; 327/513; 327/562
[58] Field of Search ................ 307/254, 255, 307/310, 572, 575, 576, 577, 579, 584, 585, 570, 494, 495, 496, 497; 327/51, 52, 53, 54, 56, 65, 66, 67, 389, 391, 427, 432, 433, 434, 482, 489, 513, 560, 561, 563, 562

[56] References Cited

U.S. PATENT DOCUMENTS

| 4,539,491 | 9/1985 | Nishioka et al. | 307/494 |
| 4,691,120 | 9/1987 | Kondo | 307/494 |
| 4,724,343 | 2/1988 | LeRoux et al. | 307/570 |
| 4,724,344 | 2/1988 | Watanabe | 307/497 |
| 4,763,021 | 8/1988 | Stickel | 307/315 |
| 4,965,468 | 10/1990 | Nicollini et al. | 307/494 |
| 4,966,443 | 2/1991 | Tateno | 307/576 |
| 5,115,154 | 5/1992 | Terado | 307/494 |
| 5,293,514 | 3/1994 | Nakagwara | 307/494 |

FOREIGN PATENT DOCUMENTS

| 0117180 | 4/1987 | European Pat. Off. . | |
| 0249541 | 12/1987 | European Pat. Off. . | |
| 0101407 | 6/1982 | Japan | 307/494 |
| 0267013 | 11/1988 | Japan | 307/497 |
| 0742965 | 6/1980 | U.S.S.R. | 307/494 |

*Primary Examiner*—Terry Cunningham
*Attorney, Agent, or Firm*—Herbert L. Lerner; Laurence A. Greenberg

[57] ABSTRACT

The coupled switching transistors of the digital current switch are connected to a controlled current source. Load resistors of the current switch are formed as controlled resistors. The L-level produced by a reference current branch is compared with a predetermined level by means of a regulating device which includes the reference current branch and a compensator, and the controlled resistor or the controlled current source are adjusted such that the L-level is equal to the predetermined level.

11 Claims, 2 Drawing Sheets

6,541,539

DIGITAL CURRENT SWITCH

BACKGROUND OF THE INVENTION

Field of the Invention

The invention relates to a digital current switch having the following characteristics:

(a) at least one first and one second transistor being coupled at a first terminal of each main current path and connected through a controllable current source to a terminal for a first supply potential;

(b) a control input of the first transistor being a terminal for an input signal, and a control input of the second transistor being a terminal for a reference signal;

(c) second terminals of the main current paths of the transistors being connected to a terminal for a second supply potential; and (d) the second terminal of the main current path of at least one of the transistors being connected to an output signal terminal and through a resistor to the terminal for the second supply potential.

Such circuits are known, for instance, from Published European Application No. 0 436 823 A1. If bipolar transistors are used as switching transistors, that circuitry technique is known as CML or current mode logic if the output is connected directly to the operating resistor, and as ECL or emitter-coupled logic if the output is connected to the operating resistor through an emitter follower. The output of the switching stage is generally loaded by a capacitor. The capacitor is essentially composed of the parasitic capacitances of the switching transistors, the input transistors of following switching stages, and a connecting line. During a switching process, the capacitor is charged in the opposite direction. The charge current flows either through the operating resistor or emitter follower transistor, or through the current source of the current switch or the current source of the emitter follower. Those circuits are typically produced in the form of integrated circuits. The absolute specifications of the components have a relatively wide range of fluctuation. Moreover, the transistor parameters, such as current amplification and base-to-emitter voltage, are relatively strongly temperature-dependent. Therefore, the currents delivered or picked up at the output of the switching stage, for reversing the charge of the parasitic capacitors, are process and temperature-dependent. Heretofore, in order to achieve the necessary speed requirements, the circuits have been dimensioned in accordance with the most unfavorable possible conditions. That means that in order to achieve a predetermined level rise at the operating resistor, the resistance is low, while in return the current impressed by the current source of the current switch or of the emitter follower transistor is dimensioned to be high. That has the disadvantage of relatively high power loss under normal operating conditions.

SUMMARY OF THE INVENTION

It is accordingly an object of the invention to provide a digital current switch stage, which overcomes the hereinafore-mentioned disadvantages of the heretofore-known devices of this general type and in which the power loss is continuously adjustable.

With the foregoing and other objects in view there is provided, in accordance with the invention, a digital current switch, comprising at least one first and at least one second transistor each having a control input and a main current path with a first and a second terminal, the first terminals being coupled together; a terminal for a first supply potential, and a controllable current source connected between the coupled first terminals of the main current paths of the transistors and the terminal for the first supply potential; the control input of the at least one first transistor being a terminal for an input signal, and the control input of the at least one second transistor being a terminal for a reference signal; a terminal for a second supply potential being connected to the second terminals of the main current paths of the transistors; an output signal terminal being connected to the second terminal of the main current path of at least one of the transistors; at least one controllable resistor connected between the second terminal of the main current path of the at least one transistor and the terminal for the second supply potential; and a regulating device controlling a resistance of the resistor and a current of the current source in dependence on one another, for increasing the current of the current source as the resistance decreases and vice versa, and for setting a voltage drop at the resistor to a predetermined value in a position of repose of the current switch.

In accordance with another feature of the invention, there is provided a reference current branch having a control input, a controllable resistor with first and second terminals, and a controllable current source with first and second terminals; the first terminal of the controllable resistor being connected to the terminal for the second supply potential, the first terminal of the controllable current source being connected to the terminal for the first supply potential, and the second terminal of the controllable resistor being coupled to the second terminal of the controllable current source; and a comparator having a first input connected to the second terminal of the controllable resistor of the reference current branch, a second input being a terminal for receiving a comparison potential, and an output being connected to a control input of each of the at least one controllable resistor of the current switch and to the control input of the reference current branch.

In accordance with a further feature of the invention, there is provided a reference current branch having a control input, a controllable resistor with first and second terminals, and a controllable current source with first and second terminals; the first terminal of the controllable resistor being connected to the terminal for the second supply potential, the first terminal of the controllable current source being connected to the terminal for the first supply potential, and the second terminal of the controllable resistor being coupled to the second terminal of the controllable current source; and a comparator having a first input connected to the second terminal of the controllable resistor of the reference current branch, a second input being a terminal for receiving a comparison potential, and an output being connected to a control input of each of the controllable current sources of the current switch and to the control input of the reference current branch.

In accordance with an added feature of the invention, there is provided a temperature-compensated constant voltage circuit having an output connected to the terminal for receiving the comparison potential, being the second input of the comparator.

In accordance with an additional feature of the invention, there is provided a bipolar transistor connected between the second terminals of the controllable resistor and the controllable current source, the first and second transistors also being bipolar transistors.

In accordance with yet another feature of the invention, the controllable resistors are MOS transistors of a first channel type.

In accordance with yet a further feature of the invention, the controllable current sources are MOS transistors of a second channel type being complementary to the first channel type.

In accordance with a concomitant feature of the invention, the controllable current source of the reference current branch is a bipolar transistor having a resistor on the emitter side.

Other features which are considered as characteristic for the invention are set forth in the appended claims.

Although the invention is illustrated and described herein as embodied in a digital current switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
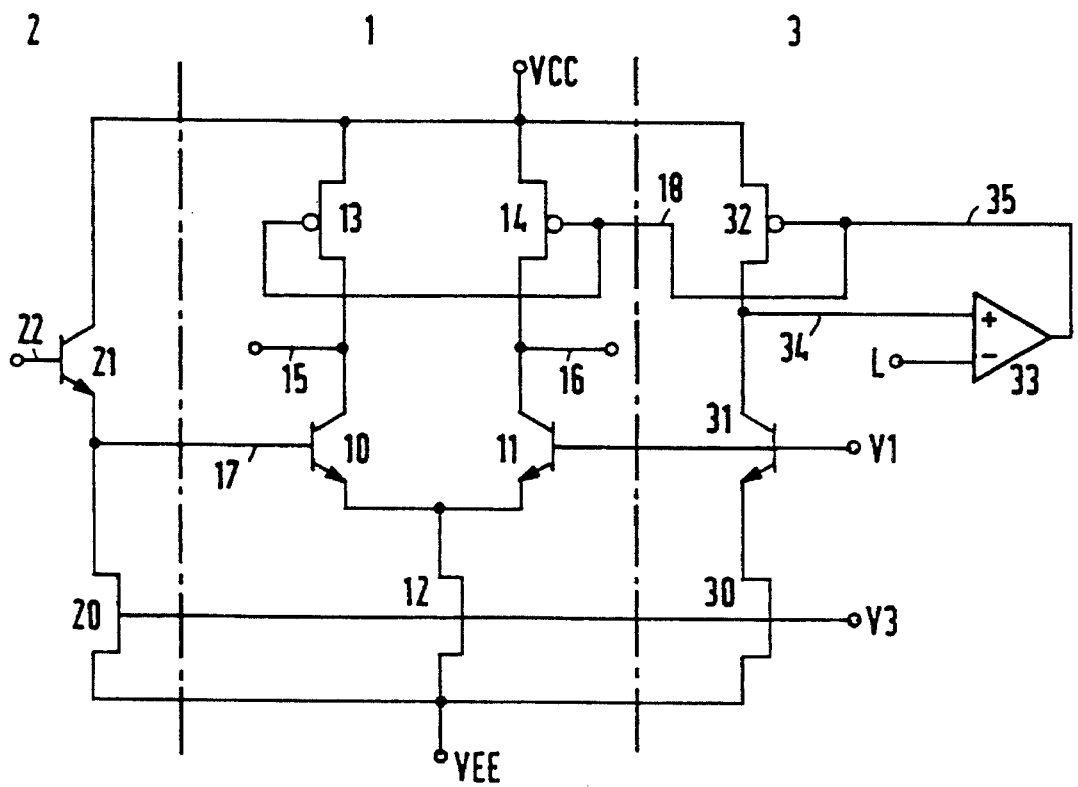
FIG. 1 is a schematic circuit diagram of a current switch according to the invention with regulation.

Referring now to the figures of the drawing in detail and first, particularly, to FIG. 1 thereof, there is seen a switching stage which includes three circuit segments 1, 2, 3. In order to explain the functional principle, the circuit segment 1 will be referred to first. The other circuit segments include further advantageous features of the invention.

The circuit segment 1 includes a current switch with two emitter-coupled bipolar transistors 10, 11, having first or emitters terminals which are connected through a controllable current source to a terminal for a first supply potential VEE. The controlled current source is constructed as an n-MOS transistor 12 having a gate terminal which is a terminal for a control potential V3. Second or collector terminals of the bipolar transistors 10, 11 are each connected through one respective controllable operating resistor to a terminal for a second supply potential VCC. One respective p-MOS transistor 13, 14 is used as each controllable resistor, and gate terminals of the transistors serve as a terminal 18 for a further control potential. The collectors of the bipolar transistors 10, 11 each have one respective first or second output signal terminal 15, 16. The output signal terminals 15, 16 carry complementary signal levels. A base of the bipolar transistor 10 is a terminal 17 for an input signal. A base of the bipolar transistor 11 is controlled by a reference signal V1.

If an H level is applied to the input signal terminal 17, the transistor 10 is conducting and the transistor 11 is blocked. A current impressed by the current source 12 flows through the p-MOS transistor 13, and the p-MOS transistor 14 is without current. An L level is then present at the output 15, while an H level is present at the output 16. When there is an L level at the input 17, the bipolar transistor 10 is blocked, while the bipolar transistor 11 is conducting. An L level ensues at the output 16, and an H level ensues at the output 15.

The n-MOS transistor 12 is connected by its source terminal to the supply potential VEE, which is negative relative to the supply potential VCC. By adjusting the potential V3, the gate-to-source voltage of the n-MOS transistor 12 and therefore its drain current are defined. The n-MOS transistor 12 consequently operates as an adjustable or controllable current source. Each of the p-MOS transistors 13, 14 is applied at its source terminal to the supply potential VCC.

Adjusting the potential applied to the terminal 18 defines the resistance of the drain-to-source paths of the p-MOS transistors 13, 14. The p-MOS transistors 13, 14 consequently act as adjustable or controllable resistors.

The L level at the outputs 15, 16 is brought about by the voltage drop at the p-MOS transistors 13 and 14 that the current impressed by the n-MOS transistor 12 brings about at the applicable p-MOS transistor, depending on the switching state of the current switch. An H level is present whenever the applicable transistor is without current. The potential V3 and the potential at the terminal 18 are adjusted in such a way that the voltage drop at whichever of the p-MOS transistors 13, 14 has a current through it, with respect to the supply potential VCC at various settings, is equal to the value that was defined for an L level. This pertains to the position of repose of the switching state. For example, if the potential V3 is chosen to be low, then the current impressed by the n-MOS transistor 12 is low. The potential at the terminal 18 must therefore be chosen to be suitably high, so that the resistance of the drain-to-source paths of the p-MOS transistors 13, 14 is high and therefore the L level at the outputs 15 and 16 will remain the same.

The outputs 15, 16 are capacitively loaded by switching stages connected downstream. The speed for charging and discharging these capacitors is determined by the currents that can be delivered or picked up at the outputs 15, 16. These currents are defined by the resistance of the drain-to-source paths of the p-MOS transistors 13, 14 or by that of the controlled current source formed by the n-MOS transistor 12. However, the parameters of these components depend on the operating temperature. Moreover, the parameters of two switching stages that are disposed in different integrated components can sometimes differ considerably from one another as a result of variations in the production process. The current driver or current pickup capacity of the outputs 15, 16 can be adjusted continuously for each switching stage through the potential V3 and the potential applied to the terminal 18. This has the advantage of permitting the current impressed by the controlled current source to be chosen to be so low that the speed requirements are just barely met. The power loss of a switching stage according to the invention can thus be chosen to be as low as possible, while taking into account temperature-dictated and process-associated fluctuations.

In the circuit segment 3 of the drawing, a regulating device is shown with which the corresponding potential for the terminal 18 is generated at a predeterminable control potential V3, so that the L level at the outputs 15, 16 will remain equal. To this end, an L level is generated constantly at one output 34 of a reference circuit. This L level is compared with a predeterminable level L in a comparator 33 having a first non-inverting input and a second inverting input. An output 35 of the comparator is coupled into the control input of the reference current branch or circuit in such a way that the level present at its output 34 is stabilized to the predeterminable level L. A circuit that corresponds to a current switch which continuously generates an L level is provided as the reference circuit.

The reference circuit includes a p-MOS transistor 32 acting as a controllable resistor having a first source terminal which is connected to the supply potential VCC, a gate terminal which is connected to the output 35 of the comparator 33, and a second drain terminal which is connected to the output 34 of the reference circuit. A bipolar transistor 31 (which may optionally also be omitted) has a collector terminal which is connected to the drain terminal of the p-MOS transistor 32. An emitter terminal of the bipolar transistor 31 is connected through the drain-to-source path of an n-MOS transistor 30 to the terminal for the supply potential VEE. In other words, a second terminal of the n-MOS transistor 30 is connected to the emitter terminal of the bipolar transistor 31 and a first terminal of the n-MOS transistor 30 is connected to the supply potential VEE. The gate terminal of the n-MOS transistor 30 is controlled by the potential V3 in accordance with the current source transistor 12 of the switching stage. The base of the bipolar transistor 31 serves as a terminal for the potential V1, in a manner corresponding to the bipolar transistor 11. An operational amplifier is preferably used as the comparator 33.

The potential V3 is then adjusted in such a way that the speed requirements for the switching stage shown in the circuit segment 1 are met. Advantageously, a temperature-dependent control potential V3 is used, so that temperature-dependent changes in component parameters are compensated for as much as possible. The comparator 33 is dimensioned in such a way that a signal is generated at its output 35 by which the p-MOS transistor 32 is readjusted until such time as the level present at the output 34 is equal to the predeterminable level L. Moreover, the terminal 35 is connected to the terminal 18 of the switching stage so that the L signals present at the respective outputs 15 and 16 are equal to the predeterminable level L. The predeterminable level L may, for instance, be fed to the integrated circuit through a terminal pad, or may be generated on the integrated circuit itself by suitable circuitry provisions.

In order to avoid saturation of the bipolar transistor 10 when there is an L level at the output 15, the input signal levels at the terminal 17 are shifted toward the supply potential VEE, relative to the output signal level at the output 15. This is achieved by means of a configuration shown in the circuit segment 2. The configuration includes a bipolar transistor 21 having a collector which is connected to the terminal for the supply potential VCC and having an emitter which is connected to the terminal 17 and through an n-MOS transistor 20 to the terminal for the supply potential VEE. A gate terminal of the n-MOS transistor 20 is controlled by the potential V3. A base of the bipolar transistor 21 is connected to a terminal 22 for a further input signal. The signal levels at the terminal 22 have the same L and H level values as the levels at the outputs 15, 16.

In order to achieve a minimum power loss of the circuit shown in the drawing, only the potential V3 is adjustable. The potential for the terminal 18 is generated by the circuit segment 3. The potential at the terminal 18 may, for example, also be supplied as an adjustable potential through an input pad.

The reference potential V1 is ideally located in the middle of the signal level present at the terminal 17. It is also conceivable for the base of the bipolar transistor 11 to be controlled by a signal that is complementary to the signal present at the input 17. The base of the bipolar transistor 31 may then be controlled by the reference potential V1, but preferably is controlled by a logical H level.

Although the switching stage shown in the circuit segment 1 includes the bipolar transistors 10, 11, it is also possible to use MOS transistors as the switching transistors. Instead of the bipolar transistors 10, 11, 31, p-MOS transistors or n-MOS transistors would then be used. Since no saturation occurs with MOS transistors, it is then possible to dispense with a circuit for level shifting as in the circuit segment 2.

The exemplary embodiment of FIG. 1 shows one load resistor each being constructed as one of the p-MOS transistors 13, 14, in each of the collector circuits of the switching transistors 10, 11. It is possible to place a controllable operating resistor in the collector circuit of only one of the switching transistors 10, 11. In that case, only one of the outputs 15 or 16 is available.

The above examples pertain to CML current switches. The invention is also applicable to ECL circuits. To that end, the outputs 15, 16 would each be followed by one emitter follower transistor having a base which is connected to the outputs 15, 16, having a collector which is connected to the terminal for the supply potential VCC, and having an emitter which is connected to the terminal for the supply potential VEE through a controllable current source, preferably in the form of an n-MOS transistor having a gate terminal which is controlled by the potential V3.

Figure 2:
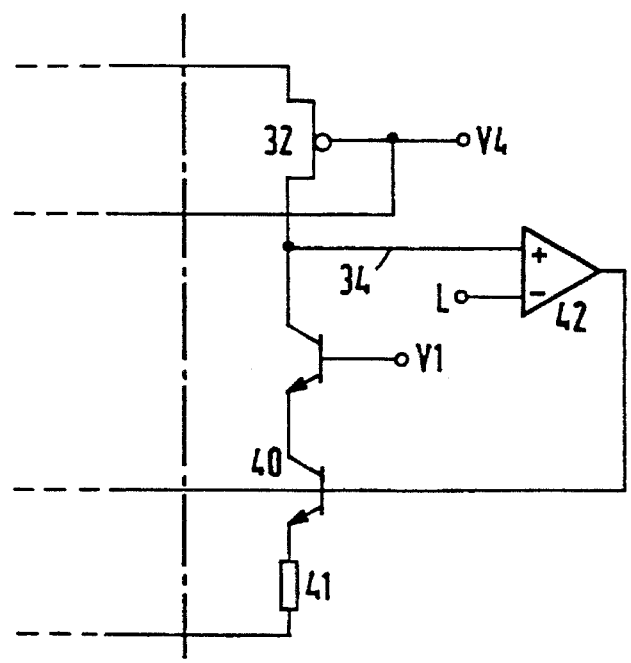
FIG. 2 is a circuit diagram of a further version of the regulation.

FIG. 2 shows a further version of the reference circuit and comparator. The reference current branch includes a controlled current source which is constructed as a bipolar transistor 40 and a resistor 41 on its emitter side. The controlled current source 40, 41 has a first terminal connected to the first supply terminal VEE and a second terminal connected to the second terminal of the MOS transistor 32. The current sources of the current switch and the current sources belonging to the emitter-follower transistors, which are connected downstream of the output of the current switch or upstream of the inputs, may likewise be constructed as bipolar transistors with a resistor on the emitter side. A comparator 42 in this case has an output connected to the control input of the controllable current sources disposed in the reference current branch, that is to the base terminal of the bipolar transistor 40. The reference current branch is controllable by a potential V4 that is applied to the gate terminal of the MOS transistor 32, which has a first terminal connected to the second supply potential VCC. Through the use of the comparator 42, the controllable current source is readjusted in such a manner that the L level at the terminal 34, which is the first terminal of the comparator, is equal to the predeterminable level L at the second input of the comparator 42.

Figure 3:
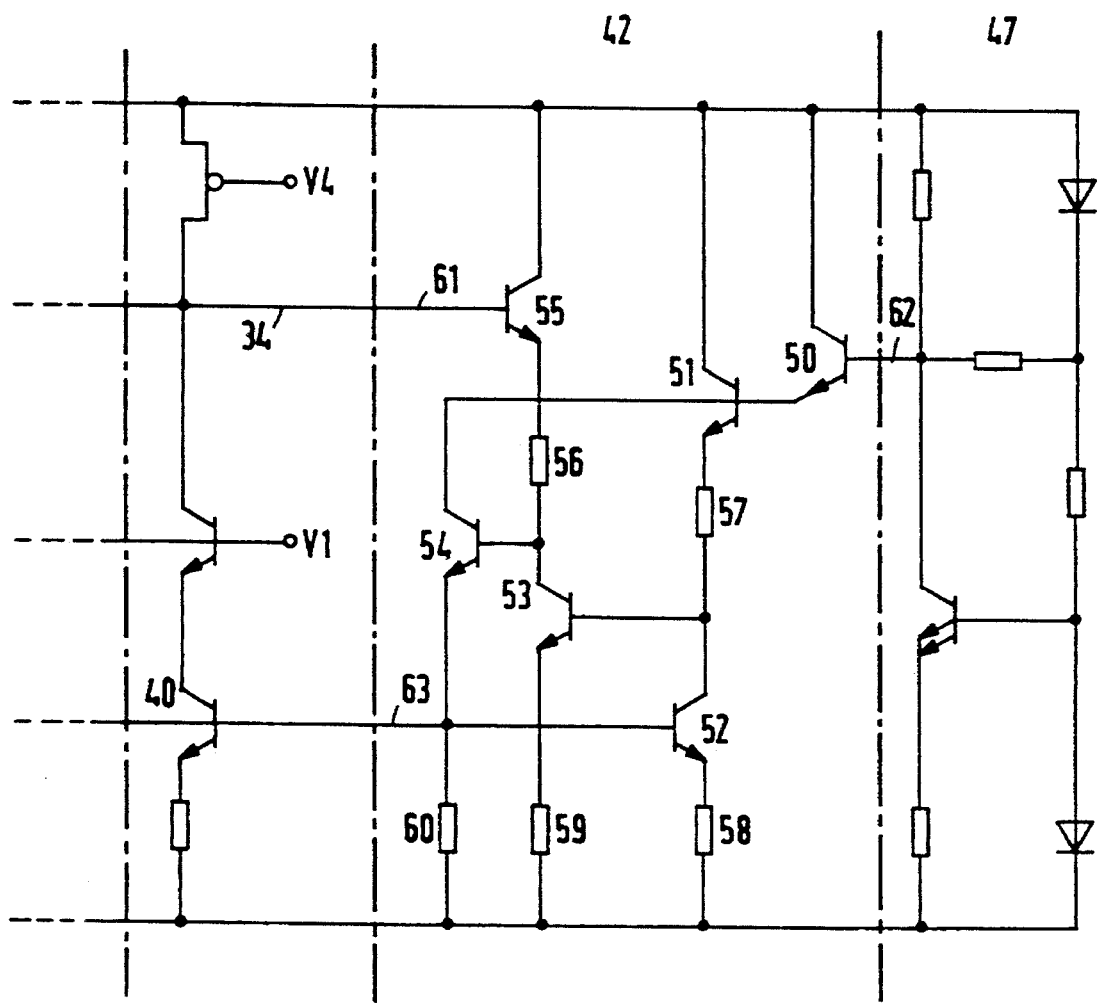
FIG. 3 is a circuit diagram of a realization of the regulation of FIG. 2 in the form of circuitry.

FIG. 3 shows one version of the comparator 42 and a configuration for generating the predeterminable level L. The level L is generated by means of a known temperature-compensated constant voltage circuit 47, which is typically called a band gap reference. A temperature-compensated constant voltage is then present at a terminal 62. The terminal 62 is connected to one of the inputs of the comparator 42, while another of the inputs 61 is connected to the terminal 34. An output 63 of the comparator 42 is connected to the base of the bipolar transistor 40. A control signal at the output 63 is generated by the comparator 42 in such a manner that the level at the input 61 is equal to the predeterminable level at the input 62.

The comparator 42 includes a transistor 50, which is connected as an emitter follower circuit with respect to the terminal 62. A transistor 51 is connected as an emitter follower circuit with respect to an emitter of the transistor 50. An emitter of the transistor 51 is connected through a resistor 57 to a collector of a transistor 52 that has an emitter which is connected through a resistor 58 to the terminal for the supply potential VEE. The collector of the transistor 52 is connected to a base of a transistor 53 that has a collector which is connected through a resistor 56 to an emitter of a transistor 55 which is connected as an emitter follower circuit with respect to the input 61. An emitter of the transistor 53 is connected through a resistor 59 to the terminal for the supply potential VEE. The collector of the transistor 53 is connected to a base of a transistor 54 which has a collector that is connected to the emitter of the transistor 50 and has an emitter which is connected through a resistor 60 to the terminal for the supply potential VEE. A base of the transistor 52 is connected to the emitter of the transistor 54 and to the output 63.

The resistors 57, 58 and the resistors 56, 59 preferably have the same resistances. The base-to-emitter voltages of the transistors 55, 53; 54, 50; and 52, 51, respectively, are the same in each case, since the same current flows through each of them. The voltage along a path including the base-to-emitter path of the transistor 55, the resistor 56, the base-to-emitter path of the transistor 54, the base-to-emitter path of the transistor 52, and the resistor 58, is equal to the voltage along a path including the terminal 62, the base-to-emitter path of the transistor 50, the base-to-emitter path of the transistor 51, the resistor 57, the base-to-emitter path of the transistor 53, and the resistor 59, with the above-mentioned conditions being taken into account. The level that is established at the output 63 is thus the level necessary in order to keep the level at the input 61 equal to the impressed, temperature-compensated level at the input 62.

I claim:

1. A digital current switch, comprising:

(a) at least one first and at least one second bipolar transistor each having a control input and a main current path with a first and a second terminal, said first terminals being coupled together;

(b) a terminal for a first supply potential, and a controllable current source connected between said coupled first terminals of said main current paths of said transistors and the terminal for the first supply potential;

(c) the control input of said at least one first transistor being a terminal for an input signal, and the control input of said at least one second transistor being a terminal for a reference signal;

(d) a terminal for a second supply potential being connected to said second terminals of said main current paths of said transistors;

(e) an output signal terminal being connected to said second terminal of said main current path of at least one of said transistors;

(f) at least one controllable resistor connected between said second terminal of said main current path of said at least one transistor and the terminal for the second supply potential, said at least one controllable resistor having a control input; and (g) a regulating device controlling one of a resistance of said resistor and a current of said current source, the other of the resistance and the current being controlled with a defined potential, and the one of the resistance and the current being controlled by said regulating device is in dependence on the defined potential such that a voltage drop across said resistor is regulated to a value of a predeterminable comparison potential value.

2. The digital current switch according to claim 1, wherein said regulating device includes a controllable resistor with first and second terminals and a control signal input, and a controllable current source with first and second terminals;

the first terminal of said controllable resistor being connected to the terminal for the second supply potential, the first terminal of said controllable current source being connected to the terminal for the first supply potential, and the second terminal of said controllable resistor being coupled to the second terminal of said controllable current source; and a comparator having a first input connected to the second terminal of said controllable resistor of said regulating device, a second input being a terminal for receiving the comparison potential, and an output being connected to the control input of each of said at least one controllable resistor of said regulating device.

3. The digital current switch according to claim 1, wherein said regulating device includes a controllable resistor with first and second terminals and a control input, and a controllable current source with first and second terminals;

the first terminal of said controllable resistor being connected to the terminal for the second supply potential, the first terminal of said controllable current source being connected to the terminal for the first supply potential, and the second terminal of said controllable resistor being coupled to the second terminal of said controllable current source; and a comparator having a first input connected to the second terminal of said controllable resistor of said regulating device, a second input being a terminal for receiving a comparison potential, and an output being connected to a control input of said controllable current source of said regulating device.

4. The digital current switch according to claim 2, including a temperature-compensated constant voltage circuit having an output connected to the terminal for receiving the comparison potential, being the second input of said comparator.

5. The digital current switch according to claim 3, including a temperature-compensated constant voltage circuit having an output connected to the terminal for receiving the comparison potential, being the second input of said comparator.

6. The digital current switch according to claim 2, wherein said regulating device further comprises a bipolar transistor connected between the second terminals of said controllable resistor and said controllable current source.

7. The digital current switch according to claim 2, wherein said controllable resistors are MOS transistors of a first channel type.

8. The digital current switch according to claim 3, wherein said controllable resistors are MOS transistors of a first channel type.

9. The digital current switch according to claim 7, wherein said controllable current sources are MOS transistors of a second channel type being complementary to the first channel type.

10. The digital current switch according to claim 8, wherein said controllable current sources are MOS transistors of a second channel type being complementary to the first channel type.

11. The digital current switch according to claim 3, wherein said controllable current source of said reference current branch is a bipolar transistor having a resistor coupled to the emitter.

* * * * *